United States Patent [19]

Pizzarello et al.

[11] 4,103,144

[45] Jul. 25, 1978

[54] LOW INDUCTANCE HEATER CONFIGURATION FOR SOLID STATE DEVICES AND MICROCIRCUIT SUBSTRATES

[75] Inventors: Frank A. Pizzarello, Yorba Linda; Theodore J. LaChapelle, Jr., Orange, both of Calif.

[73] Assignee: The United States of America as represented by the Secretary of the Air Force, Washington, D.C.

[21] Appl. No.: 744,471

[22] Filed: Nov. 24, 1976

[51] Int. Cl.² .............................................. H05B 1/00
[52] U.S. Cl. .................................. 219/209; 219/553; 338/15
[58] Field of Search ............... 219/209, 210, 541, 543, 219/552, 553; 338/15, 18, 307–309; 29/611, 620, 621

[56] References Cited

U.S. PATENT DOCUMENTS

| 2,629,166 | 2/1953 | Marsten et al. ........................ 29/620 |
| 3,414,704 | 12/1968 | Flanagan .............................. 219/210 |
| 3,649,944 | 3/1972 | Caddock ............................... 338/328 |

Primary Examiner—C. L. Albritton
Attorney, Agent, or Firm—Joseph E. Rusz; Willard R. Matthews, Jr.

[57] ABSTRACT

A low inductance, rapid response, heater for silicon photodetector and microcircuit applications is realized by depositing on a substrate surface a heater whose contact terminals and resistance element are configured to eliminate electrical noise due to the induced currents that commonly result from on-off switching action. The heater geometry utilizes a concentric ring configuration and consists of an inner disc-shaped contact terminal, a ring-shaped resistive heater element surrounding the disc-shaped contact terminal and an outer peripheral contact terminal surrounding the heater element. The heater is operated by means of an electrical current flowing in a radial direction through the circuit comprising the outer peripheral contact terminal, the annular resistive heater element and the inner contact terminal.

4 Claims, 2 Drawing Figures

LOW INDUCTANCE HEATER CONFIGURATION FOR SOLID STATE DEVICES AND MICROCIRCUIT SUBSTRATES

STATEMENT OF GOVERNMENT INTEREST

The invention described herein may be manufactured and used by or for the Government for governmental purposes without the payment of any royalty thereon.

BACKGROUND OF THE INVENTION

This invention relates to electrical resistance heaters, and in particular to the use of such heaters in microcircuit substrate and solid state applications.

Electrical resistive heaters are used on microcircuit substrates to heat various elements and are also used with silicon photodetectors to maintain an appropriate temperature for optimum detection operations. In either instance rapid response and uniform heating characteristics are desirable. In the case of silicon photodetectors and in certain microcircuit applications it is also necessary that fringing magnetic fields and their concommitant inductive interactions be elminated. For instance, since the sensitivity of the photodetector is limited by electrical noise the heater must be designed to eliminate any such noise contribution due to currents induced by turning the heater on and off. Conventional resistance heaters used in these applications commonly have geometric configurations that induce fringing magnetic fields. The present invention is directed toward providing a heater that overcomes this deficiency and that further exhibits rapid response and uniform heating characteristics.

The annular shape of the resistance element of this invention has an additional advantage over the usual narrow width or long serpentine shape of prior art resistive heating elements. Thin film and thick film resistors, including cermet type, can degrade during use by developing fine cracks, especially as a result of many fast temperature changes or on-off cycling. One such crack in a narrow width resistor can easily extend completely across the small dimension and result in an open circuit. The annular shape of the disclosed resistor permits small cracks to occur without resulting in an open circuit.

SUMMARY OF THE INVENTION

The invention comprehends an electrical resistive heater element for microcircuit substrate and solid state device applications that has a particular geometry designed to provide both rapid uniform heating and the elimination of fringing magnetic fields. Specifically, the heater element geometry is configured such that the heater electrical resistive element is a ring-shaped deposit of cermet or other resistive material that encompasses and is contiguous with a first smaller disc-shaped electrical contact. The ring-shaped resistive element is itself encompassed by a contiguous peripheral second electrical contact. An electrical current is fed through the outer contact, the resistive element and the inner contact, to effect rapid uniform heating of the unit. The annular shaped heater element with the current flow toward the center contact essentially eliminates the fringing magnetic fields which give rise to inductive interaction.

It is a principal object of the invention to provide a new and improved electrical resistive heater for photodetectors and microcircuit substrates.

It is another object of the invention to provide an electrical resistance heater for photodetectors and microcircuit substrates that has rapid response and uniform heating capabilities.

It is another object of the invention to provide an electrical resistance heater for photodetectors and microcircuit substrates that is not subject to fringing magnetic fields and that does not cause inductive interaction with components being heated by it.

These, together with other objects, features and advantages of the invention, will become more readily apparent from the following detailed description when taken in conjunction with the illustrative embodiments in the accompanying drawings.

DETAILED DESCRIPTION OF THE PREFERRED EMBODIMENT

Figure 1:
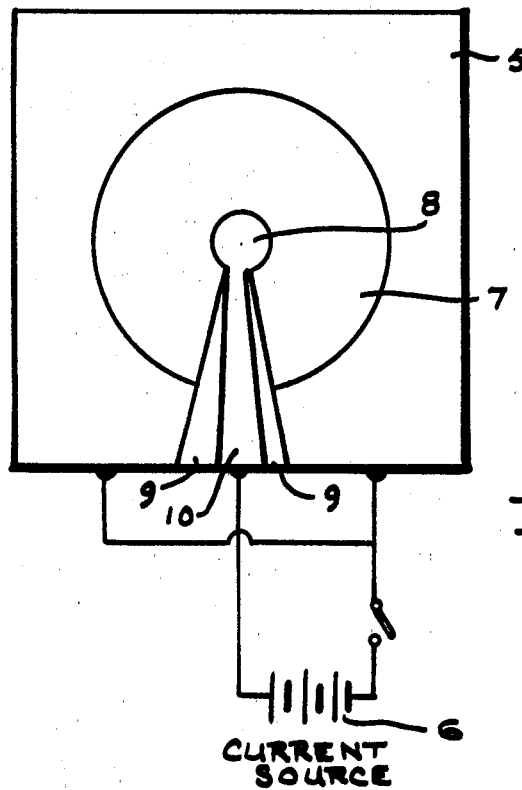
FIG. 1 is a front view of one presently preferred embodiment of the invention.
Figure 2:
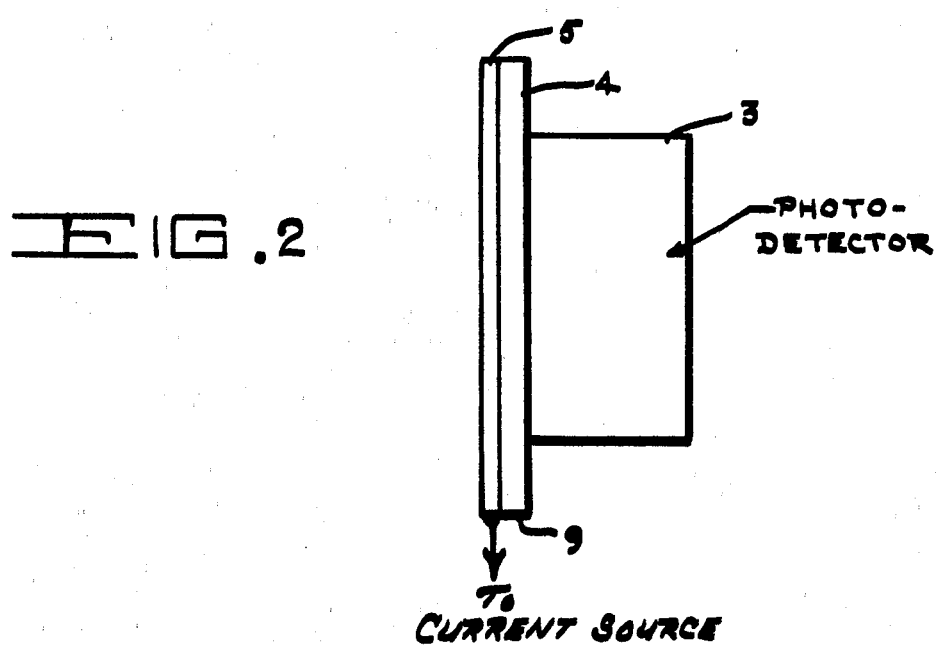
FIG. 2 is a side view of the embodiment of the invention shown in FIG. 1.

Referring now to FIGS. 1 and 2, the heater of the invention is shown to comprise ceramic sheet member 9, inner disc-shaped electrical contact 8, ring-shaped resistive heater element 7, and outer peripheral electrical contact 5. Inner and outer electrical contacts 8 and 5 are conductive material such as copper and resistive heater element 7 can be any electrical resistance material commonly used for heater filaments such as cermet or the like. Ceramic sheet member 9 can be any ceramic material such as $Al_2O_3$ or BeO having suitable electrical and heat transfer characteristics. The electrical contacts and resistive heater element can be deposited on one plane surface of the ceramic sheet in the conventional manner. Photodetector 3 is eutectically bonded to the opposite side of the sheet. A current source 6 is connected to outer electrical contact 5 and to inner electrical contact 8 through tab 10 (or by any other suitable connecting means) to cause a uniform current to flow through resistance heater element 7 preferably in a direction from the outer contact 5 to the inner contact 8.

While the invention has been described in its preferred embodiment, it is understood that the words which have been used are words of description rather than words of limitation and that changes within the purview of the appended claims may be made without departing from the scope and spirit of the invention in its broader aspects.

What is claimed is:

1. A solid state device heater comprising
   a ceramic substrate sheet member having one plane surface adapted to permit eutective bonding of a photodetector device thereto and a resistance heater element deposited on the opposite plane surface thereof, said heater element comprising a disc of electrically conductive material, an annular region of resistive material encompassing and in electrical contact with said disc, and a peripheral region of electrically conductive material encompassing and in electrical contact with said region of resistive material,
   a source of electrical current, and
   means connecting said source of electrical current between said disc and said peripheral region of electrically conductive material.

2. A solid state device heater as defined in claim 1 wherein said region of resistive material consists of cermet.

3. A solid state device heater as defined in claim 2 wherein said substrate sheet member consists of $Al_2O_3$.

4. A solid state device heater as defined in claim 2 wherein said substrate sheet member consists of BeO.

* * * * *